United States Patent [19]

Prokosch et al.

[11] Patent Number: 5,233,152
[45] Date of Patent: Aug. 3, 1993

[54] ROBOTIC LASER SOLDERING APPARATUS FOR AUTOMATED SURFACE ASSEMBLY OF MICROSCOPIC COMPONENTS

[75] Inventors: Steve A. Prokosch, North Saint Paul; Kevin R. Aufderhar, Coon Rapids, both of Minn.

[73] Assignee: Honeywell Inc., Minneapolis, Minn.

[21] Appl. No.: 512,307

[22] Filed: Apr. 1, 1991

Related U.S. Application Data

[62] Division of Ser. No. 369,394, Jun. 21, 1989, Pat. No. 5,023,426.

[51] Int. Cl.⁵ .............................................. B23K 26/00
[52] U.S. Cl. ............................. 219/121.63; 219/85.12
[58] Field of Search ..................... 219/121.63, 121.64, 219/85.12; 279/3

[56] References Cited

U.S. PATENT DOCUMENTS

| | | | |
|---|---|---|---|
| 3,572,736 | 3/1971 | Lynch | 279/3 |
| 4,404,453 | 9/1983 | Gotman | 219/121.64 |
| 4,589,586 | 5/1986 | Polansky | 279/3 X |

Primary Examiner—C. L. Albritton
Attorney, Agent, or Firm—Ian D. MacKinnon

[57] ABSTRACT

A robotic laser soldering apparatus for automated assembly of microscopic components which is capable of acquiring, orienting, and soldering very small electrical components, such as gallium arsenide (GaAs) beam lead diodes, to a circuit board having a soft substrate. The apparatus includes a vacuum pickup means for picking up and holding the diode, pattern recognition means for determining the proper positioning of the diode on the circuit board, and a laser for soldering the diode leads.

6 Claims, 3 Drawing Sheets

ROBOTIC LASER SOLDERING APPARATUS FOR AUTOMATED SURFACE ASSEMBLY OF MICROSCOPIC COMPONENTS

The Government has rights in this invention pursuant to Contract No. DAAA21-85-C-0320 awarded by the Department of the Army.

This application is a division of application Ser. No. 369,394, filed Jun. 21, 1989, now U.S. Pat. No. 5,023,426.

BACKGROUND OF THE INVENTION

1. Field of the Invention

This invention relates in general to an apparatus for automatically placing and soldering very small electrical components onto a circuit board.

2. Description of the Prior Art

Many high frequency circuits require the use of very small, discrete electrical components. For example, a KA band millimeter wave radar transceiver commonly requires the use of microscopic gallium arsenide (GaAs) transceiver diodes. These transceiver diodes commonly have dimensions of only 0.008"×0.008"×0.0015". Two foil leads or "beam leads" are attached, giving the component an overall length of 0.025". The beam leads of the diodes must be soldered to the transceiver microstrip with an extremely high degree of accuracy with respect to the circuit artwork.

Automatic chip placing equipment capable of handling components of roughly the same size has been available for some time. These machines utilize miniature mechanical collets which act as fingers to square the chip as it is gripped. The component is then ejected from the collet by an ejection pin to a spot adhesive which holds the component in place on the circuit board.

Gallium arsenide is an extremely fragile substance, however. In the configuration of the beam leaded package, even slight mechanical contact to the body of the diode creates a serious risk of cracking or breaking the chip. Hence, the use of a mechanical collet would be unacceptable for handling the GaAs components in the assembly of the radar transceiver.

In many situations, the very small GaAs components could be bonded to a rigid ceramic substrate using thermal compression bonding. For KA band operation, however, a PTFE laminated substrate offers cost and performance advantages over ceramic substrates. PTFE laminated substrates comprise a relatively soft material, and hence, thermal compression bonding results in small depressions in the microstrip which adversely affect the performance of the transceiver.

As a consequence of the fragility of the GaAs diodes and the softness of the PTFE substrates, assembly of the transceivers has been performed by using a hand soldering iron with the assistance of a high power microscope. The minute components invariably shift position due, in part, to the surface tension created by the molten solder. Thus, the diode must be physically held in place by the technician using a toothpick or other pointed tool. This task is painstakingly tedious, the solder joints are not always reliable, and there is a risk of damage to the very expensive beam leaded components.

As a result, there is a need for an apparatus which is capable of automatically handling very small electrical components without damage thereto and for soldering the components to a circuit board.

SUMMARY OF THE INVENTION

In accordance, the present invention provides a robotic apparatus having machine vision for selecting a very small electrical component from an initial storage location and for moving the selected component with respect to a circuit board so that the selected component is positioned at a pre-selected location on the circuit board. The apparatus then solders the selected component to the pads of the circuit board. The apparatus comprises a vacuum pickup means having a robotic arm connected to a vacuum pickup tool for picking up and holding the selected component, a first pattern recognition means for determining the position of the selected component while it is being held by the vacuum pickup means, a staging unit for supporting the circuit board, a second pattern recognition means for determining the position of the circuit board on the staging unit, a means responsive to the outputs of the first and second pattern recognition means for moving the vacuum pickup means with the selected component held thereby toward the circuit board and for positioning the selected component on a pre-selected location on the circuit board, and a laser for melting solder on the pre-selected location on the circuit board to create a soldered joint between the circuit board and the selected component.

The vacuum pickup tool, which is connected to the robotic arm, comprises a flat plate-like member having first and second spaced apart parallel side surfaces. An extension at one end of the vacuum pickup tool has a port which allows a vacuum to suction the diode and hold it for positioning on the circuit board.

DETAILED DESCRIPTION OF THE INVENTION

Figure 1:
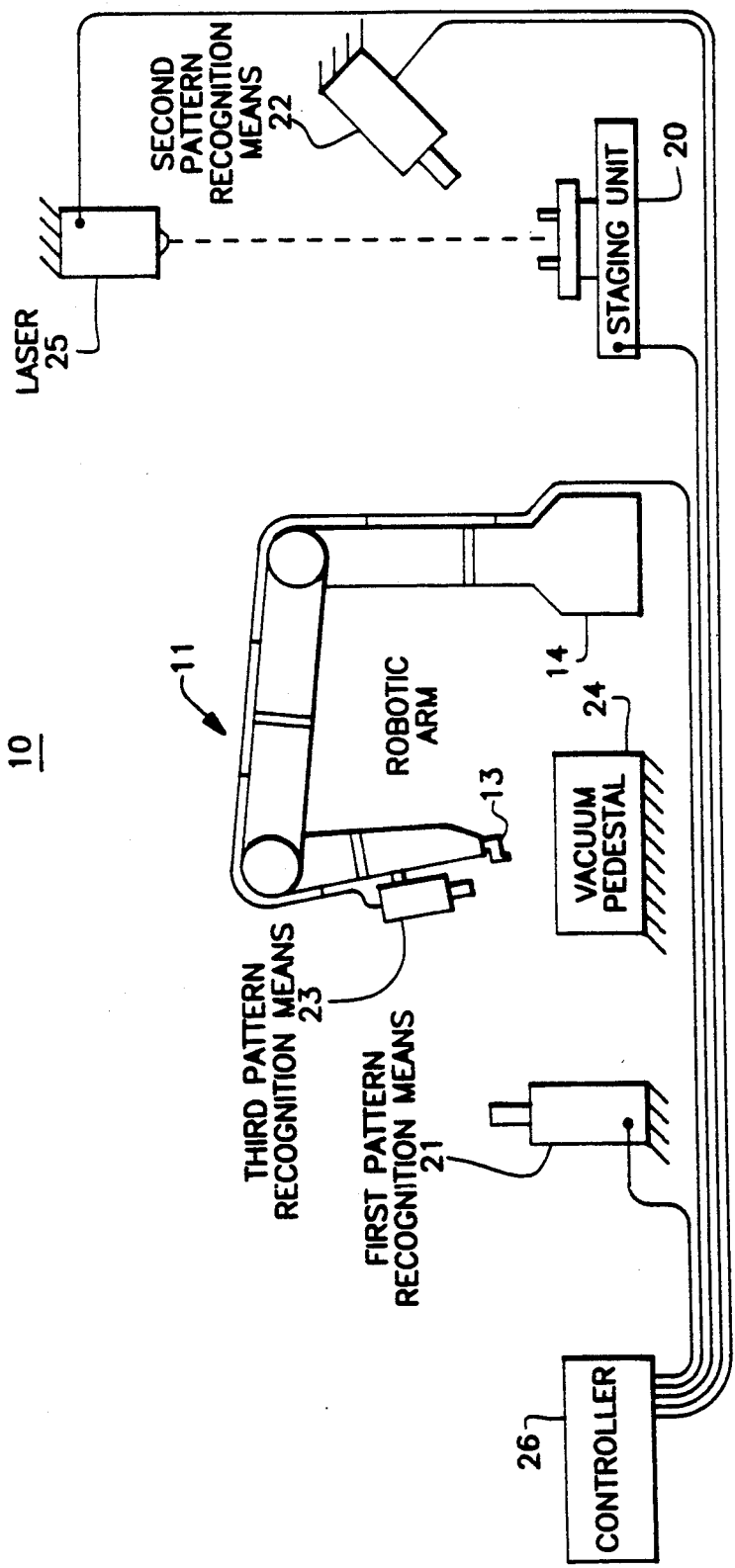
FIG. 1 is a schematic view of the robotic laser soldering apparatus.

Referring to FIG. 1, there is shown a schematic view of a preferred embodiment of the robotic laser soldering apparatus 10 for automated surface assembly of microscopic components. The apparatus automatically acquires, orients, and solders gallium arsenide (GaAs) beam lead diodes to a circuit board having a soft substrate. The preferred embodiment comprises a vacuum pickup means 11, a three axis servo-driven staging unit 20, a first 21, second 22, and third 23 pattern recognition means, a vacuum pedestal 24, a YAG laser 25, and a controller 26.

Figure 1A:
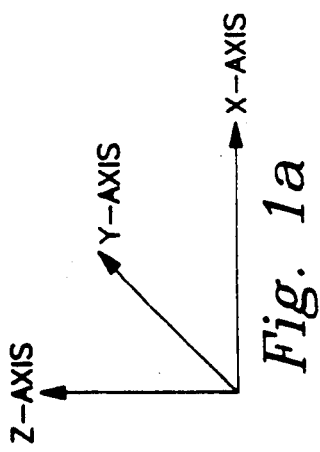
FIG. 1a shows a special coordinate system.

The vacuum pickup means 11 consists of a four axis Cartesian robotic arm 12 connected to a specifically designed vacuum pickup tool 13. The robotic arm 12, which may be of the type available from Accusembler Robots (Seiko Epson) (part number SKE-0101-B201), is guided by machine vision and has a positional resolution of +/−4 microns (0.0008 inch). Its base 14 is movable along both the X and Y axes, as referenced in FIG. 1a, allowing the overall robotic arm 12 to be moveable along the X, Y and Z axes as well as rotatable. The robotic arm 12 moves the vacuum pickup tool 13 for acquisition, positioning, and soldering of the diode or other very small electrical component.

Figure 2:
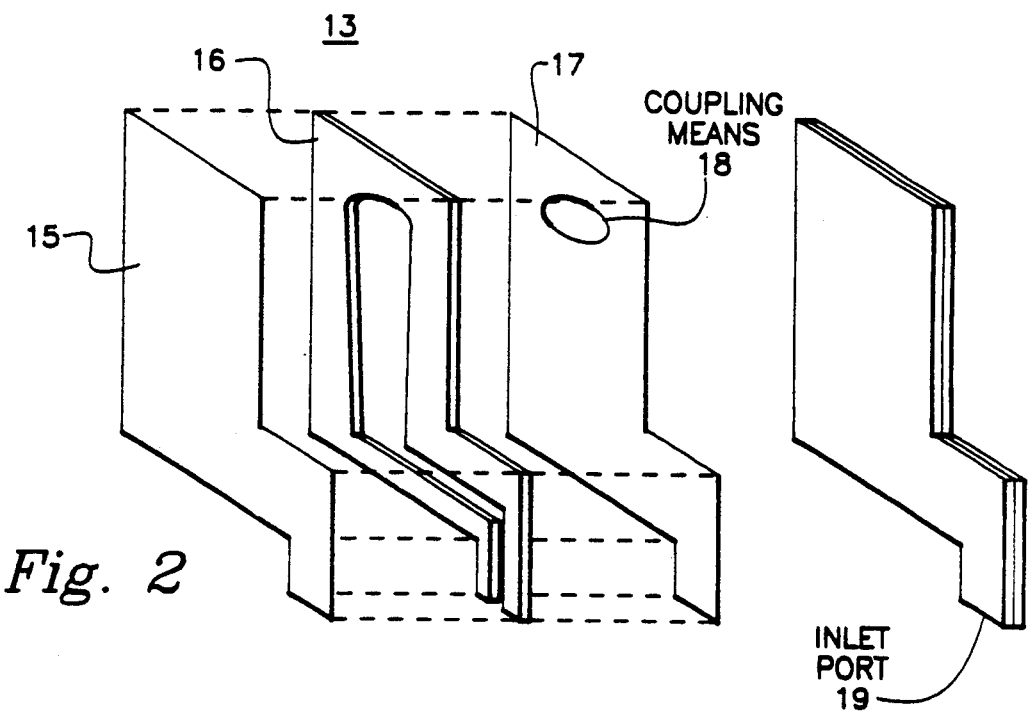
FIG. 2 shows perspective views of the disassembled and assembled vacuum pickup tool.

FIG. 2 shows an expanded view of the vacuum pickup tool 13, both disassembled and assembled. Three pieces of steel plates 15, 16, and 17 are laminated together. The outer two plates 15 and 17 are 0.005" thick. The center plate 16 is 0.015" thick and has a slit generated by wire electron discharge machining. When the plates are laminated and sealed with adhesive, the slit in plate 16 forms a vacuum channel between an inlet port 19 and the hole in plate 17 which forms a coupling means 18 to a vacuum source. When a vacuum is applied at the coupling means 18, the blade-shaped device allows a vacuum to transmit to the port 19. The vacuum is used to suction the diode at the port 19 for the delicate pickup and transporting operations.

The three axis servo-driven staging unit 20 of FIG. 1, upon which the circuit board is fixtured, is also guided in position by machine vision. It may be of the type also available from Accusembler Robots (part number SSR-X05311-ZU), and is movable along the X and Y axes and rotational about the Z axis. The staging unit 20 has a positional resolution of +/−0.5 micron (0.00002 inch) and is used to position the circuit board with respect to a fixed laser beam path from laser 25 and to compensate for small deviations in the position of the diode while it is being held by the vacuum pickup tool 13.

The first, second, and third pattern recognition means, also available from Accusembler Robots, provide machine vision to the system. Each consists of a video camera connected to a video processor. The first pattern recognition means 21 has a video camera which is fixtured and an image processor output for determining the position of the diode as it is held by the vacuum pickup tool 13. The second pattern recognition means 22 has a video camera which is also fixtured and an image processor output for determining the location of the diode set down point on the circuit board. The third pattern recognition means 23 has a video camera which is mounted on the robotic arm 12 and an image processor output for determining the location of the diodes or other very small components at an initial location.

The vacuum pedestal 24 provides an initial location from which the diodes are acquired by the vacuum pickup means 11. Porous gel pack trays contain the diodes initially. One of these trays is placed on the vacuum pedestal 24 which backlights the diodes and applies a vacuum seal to the undersurface of the gel pack. As the vacuum is applied, the tacky gel which holds the diodes in place on the tray is pulled away, thereby freeing the diodes for removal by the vacuum pickup means 11.

Figure 3:
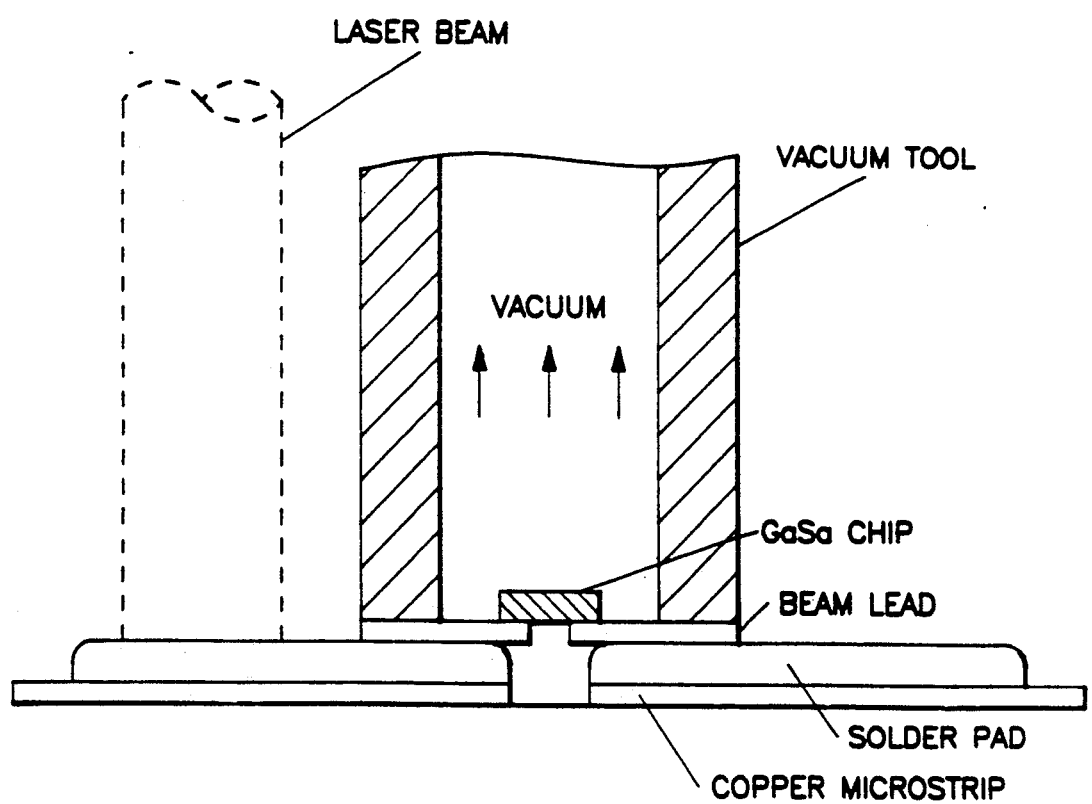
FIG. 3 is a side view of the vacuum pickup tool while it is holding a beam lead diode in place on a circuit board microstrip.

An Nd: YAG laser 25, available from Control Laser Corp. (part number 510QT), is used to solder the diode to the pads of the circuit board. Prior to the process, the circuit board is prepared by depositing solder and a fluxing agent on the pads of the circuit board. After the circuit board and diode have been positioned by the apparatus 10, the laser 25 is energized and a laser beam reaches the pad site, causing the solder to reflow and create a solder joint between the diode lead and circuit board pad. Using this technique, heat is applied to the solder joint with pinpoint accuracy and extreme consistency without requiring mechanical contact of a heated tool. In addition, the laser 25 requires a minimal channel of access to the solder location. Since the diode pickup tool 13 is very thin, the laser 25 can be fired at the bond site while the diode is held in place by the tool. Referring to FIG. 3, the tool's blade-like design allows the laser to bond either diode lead by simply shifting the robotic arm 12 and the staging unit 20 a small amount with respect to the laser beam, rather than having to rotate the vacuum pickup tool 13 180 degrees.

The controller 26 coordinates the activity of the entire system. The only human intervention required is to place the diode container and the circuit board in the work area. The controller 26 includes a means responsive to the outputs of the first 21 and second 22 pattern recognition means for moving the vacuum pickup means 11 with the diode held thereby toward the circuit board and for positioning the selected component in a pre-selected orientation at a pre-selected location on the circuit board. The processing tasks of the controller are accomplished by way of a microcomputer. Using known image processing and recognition techniques, the output of each pattern recognition means is connected to the microcomputer for determining the location of a diode on the vacuum pedestal 24, the offset position of the diode as it is held by the vacuum pickup tool 13, and the bond site location on the circuit board where the diode is to be soldered. After processing the outputs of the three pattern recognition means, the controller 26 provides outputs to control the positions of the robotic arm 12 and the staging unit 20. Due to the extremely high positional resolution of each pattern recognition means, 21, 22, and 23, the robotic arm 12, and the staging unit 20, the system is capable of performing the delicate assembly process.

The process is performed in a systematic manner. An operator first places the circuit board into a nest which is mounted on the three axis servo-driven staging unit 20. The nest holds the circuit board at a fixed position on the staging unit 20. The operator also places the gel pack tray containing the beam lead diodes on the vacuum pedestal 24. The video camera of the third pattern recognition means 23 is automatically positioned by the robotic arm 12 to view the diodes on the tray and its output is processed by an image processor. With this output, the image processor of the third pattern recognition means 23 determines the location of a selected diode on the vacuum pedestal 24. Using this information, the controller 26 commands the robotic arm 12 to lower the vacuum pickup tool 13 on the diode for acquisition.

Figure 4:
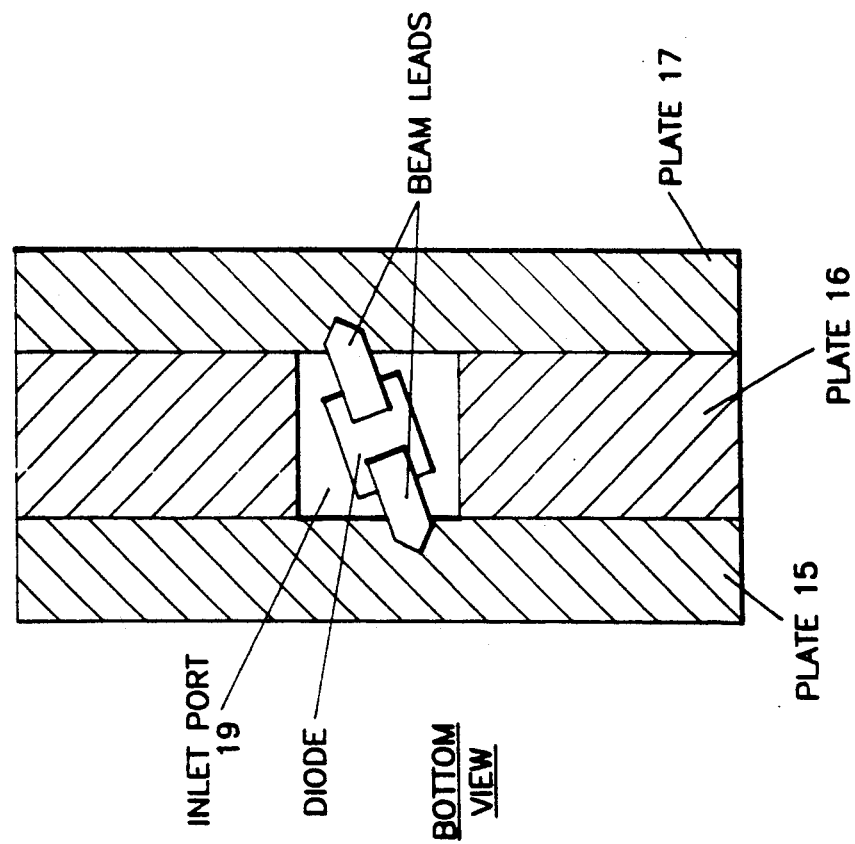
FIG. 4 is a bottom view of the vacuum pickup tool as it is holding a diode.

The diode is then suctioned at the part 19 of the vacuum pickup tool 13, removed off the tray, and transported over the video camera of the first pattern recognition means 21. The robotic arm 11 position at this point serves as a location datum. The video camera views upward at the undersurface of the diode as it is held by the vacuum pickup tool 13. FIG. 4 shows the diode as it may be positioned at the port 19 of the vacuum pickup tool 13. The image processor of the first pattern recognition means 21 processes the output of this video camera to determine the offset of the diode from the center of the vacuum tool. The diode's rotational position on the vacuum tool is also determined. This information is used to properly position the circuit board in order to compensate for the possible differing positions of the diode as it is held by the vacuum pickup tool 13.

Next, the staging unit 20, which is supporting the circuit board, is driven beneath a video camera of the second pattern recognition means 22. The position of this camera is also fixtured, and its function is to determine the location of the set down point of the diode on the circuit board. Information provided by the first 21 and second 22 pattern recognition means is used to calculate the offset motion required by the staging unit 20 to compensate for all deviations in circuit board artwork and diode acquisition positions on the vacuum pickup tool 13. The staging unit 20 then moves to this offset position.

After the circuit board is positioned by the staging unit 20, the robotic arm 12 moves to a second datum location. This location is established so that a diode which is perfectly centered in the vacuum pickup tool port 19 will be perfectly located on the circuit board with respect to the stationary laser beam emitted from the laser 25. Since the staging unit 20 has previously adjusted for any offset between the diode and vacuum pickup tool 13, the diode is held properly in position on the circuit board. When holding the diode to the circuit, a load of about 2 grams is applied to the diode beam leads.

The Nd:YAG laser 25, whose beam is transmitted through a path of beam benders to the bonding site, is energized. The laser beam hits the solder pad such that the solder reflows and creates a good solder joint between one lead of the diode and the circuit board. After the first diode beam lead has been soldered, the robotic arm 12 releases the diode and raises slightly above the circuit board. Both the robotic arm 12 and the staging unit 20 then move simultaneously so that the opposite soldering site for the other lead is positioned under the laser beam path. The robotic arm 12 then lowers the vacuum pickup tool 13 to hold the opposite diode lead down. The laser 25 is again energized, creating a good solder joint. Upon completion, the robotic arm 12 goes back to find the next diode on the tray and the staging unit 20 positions the next bond site under the video camera of the third pattern recognition means 23. The process is then repeated until the assembly is complete.

Figure 5:
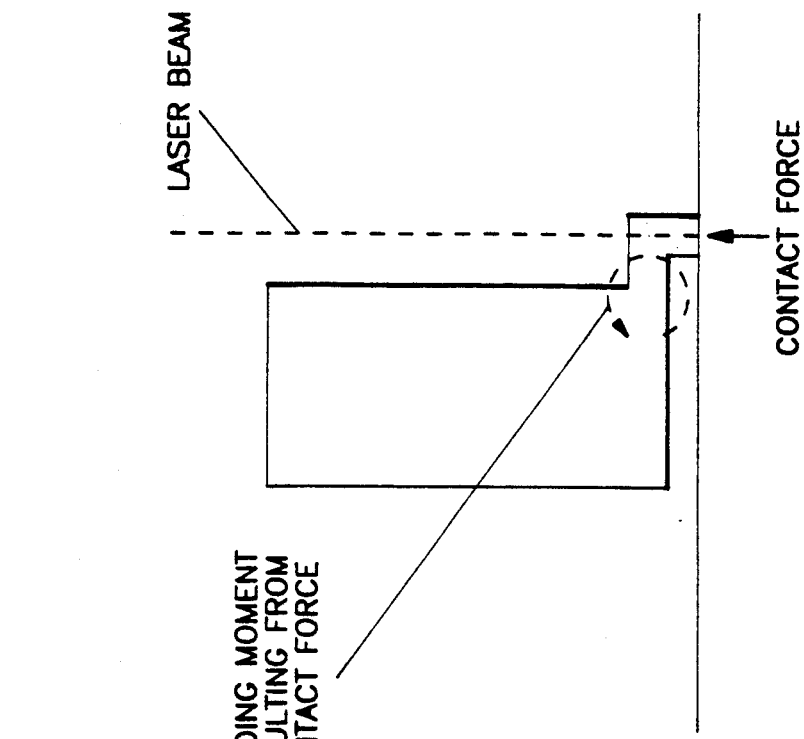
FIG. 5 is a view of the vacuum pickup tool as it positions the diode for soldering on the circuit board.

The vacuum pickup tool 13 is designed to be resistant to bending moments, as shown in FIG. 5. The tool 13 allows clear access of the laser beam to the bond site from either of its sides. The vacuum inlet port 19 is rectangularly shaped to closely approximate the shape of the diode chip. Therefore, the tool 13 can hold the delicate chip without touching it. The thin plates of the tool contact the beam leads to keep the diode from being swallowed up by the vacuum. When holding the component on the surface of the circuit board during soldering, the thin plates "step" on the leads to hold them firmly on the solder pads. The tool 13 is made of carbon steel which can be blackened by oxidizing. This provides visual contrast between the tool and the component, which is crucial in order for the machine vision to function. Finally, the vacuum slit area expands internally so that a particle which is small enough to be drawn into the port 19 will be sucked completely through, minimizing clogging problems.

What is claimed is:

1. A vacuum pickup tool for picking up and holding very small electrical components having electricial leads on the side of said electrical components, wherein the electrical leads of the electrical component contact said vacuum pickup tool, said vacuum pickup tool comprising:

a flat plate-like member having first and second spaced apart parallel side surfaces, a port between said parallel side surfaces, said parallel side surfaces being spaced apart such that said port creates a space between said parallel side surfaces having a width greater than the width of the electrical component but less than the length of the leads on both sides of the electrical component, a coupling means on one of said side surfaces of said member, and conduit means within said member and connecting said port and said coupling means, and wherein if a vacuum is connected from an external vacuum source the vacuum is transmitted to said port enabling said vacuum pickup tool to pick up the electrical component having the leads of the electrical component preventing the electrical component from passing through said port.

2. The vacuum pickup tool of claim 1 wherein said member comprises at least two plates laminated together.

3. The vacuum pickup tool of claim 1 wherein said member is oxidized.

4. The vacuum pickup tool of claim 1 wherein said conduit means is further characterized by said conduit means expanding internally from said port to said coupling means.

5. The vacuum pickup tool of claim 2 wherein said member comprises three plates, a right plate, a left plate, and a middle plate, and wherein said right plate and said left plate are 0.005 inches thick and said middle plate is 0.015 inches thick.

6. The vacuum pickup tool of claim 1 further comprising an extension, said port being located on said extension, and said extension providing a bending moment in said vacuum pickup tool.

* * * * *